(12) United States Patent  (10) Patent No.: US 7,951,244 B2
Becker et al.  (45) Date of Patent: May 31, 2011

(54) LIQUID CLEANING APPARATUS FOR CLEANING PRINTED CIRCUIT BOARDS

(75) Inventors: Eric Becker, Lebanon, MO (US); Dirk Ellis, Richland, MO (US)

(73) Assignee: Illinois Tool Works Inc., Glenview, IL (US)

( * ) Notice: Subject to any disclaimer, the term of this patent is extended or adjusted under 35 U.S.C. 154(b) by 51 days.

(21) Appl. No.: 11/972,939

(22) Filed: Jan. 11, 2008

(65) Prior Publication Data

US 2009/0178695 A1   Jul. 16, 2009

(51) Int. Cl.
B08B 3/02 (2006.01)
B08B 3/10 (2006.01)

(52) U.S. Cl. ............ 134/15; 134/34; 134/137; 134/147; 134/148; 134/184; 134/198; 134/61

(58) Field of Classification Search ............ 134/34, 134/15
See application file for complete search history.

(56) References Cited

U.S. PATENT DOCUMENTS

| | | | |
|---|---|---|---|
| 3,568,935 A | 3/1971 | Hoffman | |
| 3,695,283 A | 10/1972 | Ringwall | |
| 3,774,626 A | 11/1973 | Schweitzer | |
| 3,868,272 A * | 2/1975 | Tardoskegyi | ............... 134/26 |
| 4,052,002 A | 10/1977 | Stouffer et al. | |
| 4,107,990 A | 8/1978 | Ringwall | |
| 4,157,161 A | 6/1979 | Bauer | |
| 4,257,559 A | 3/1981 | Noren | |
| 4,325,235 A | 4/1982 | Bauer et al. | |
| 4,463,904 A | 8/1984 | Bray, Jr. | |
| 4,596,364 A | 6/1986 | Bauer | |
| 4,604,144 A | 8/1986 | Wong | |
| 5,028,007 A | 7/1991 | Wokal | |
| 5,050,249 A | 9/1991 | Takeda et al. | |
| 5,129,956 A | 7/1992 | Pickering et al. | |
| 5,197,673 A | 3/1993 | Sullivan | |
| 5,218,988 A | 6/1993 | McNamara et al. | |
| 5,246,023 A * | 9/1993 | Breunsbach et al. | ....... 134/57 R |
| 5,387,313 A | 2/1995 | Thoms | |
| 5,417,258 A | 5/1995 | Privas | |
| 5,507,877 A | 4/1996 | Magsig et al. | |
| 5,906,317 A | 5/1999 | Srinath | |

(Continued)

FOREIGN PATENT DOCUMENTS

DE    1503901    7/1969

(Continued)

OTHER PUBLICATIONS

Stero, SD-2RA, Door Type-20" Racks, Apr. 1984, 4 pages.

(Continued)

*Primary Examiner* — Michael Komakov
*Assistant Examiner* — Natasha Campbell
(74) *Attorney, Agent, or Firm* — Thompson Hine LLP

(57) ABSTRACT

A method and apparatus for cleaning printed circuit boards are provided. The method includes providing a cleaning apparatus with a housing having a conveyance mechanism for carrying printed circuit boards through the housing. The cleaning apparatus has at least a prewash station, a wash station and a final rinse station therein. The printed circuit boards are carried on the conveyance mechanism to the prewash station. A plurality of fluidic oscillator nozzles of the prewash station are utilized to direct liquid onto the printed circuit boards. Each fluidic oscillator nozzle outputs a stream of liquid with an instantaneous direction that oscillates back and forth relative to a nozzle axis over time.

8 Claims, 5 Drawing Sheets

U.S. PATENT DOCUMENTS

| | | | |
|---|---|---|---|
| 5,967,418 | A | 10/1999 | MacDonald et al. |
| 6,110,292 | A | 8/2000 | Jewett et al. |
| 6,260,231 | B1 | 7/2001 | Bybee et al. |
| 6,315,221 | B1 | 11/2001 | Goenka et al. |
| 6,325,081 | B1 | 12/2001 | Miki et al. |
| 6,467,476 | B1 | 10/2002 | Ivrie et al. |
| 6,550,607 | B1 | 4/2003 | Watson et al. |
| 6,736,340 | B1 | 5/2004 | Wang |
| 6,739,526 | B2 | 5/2004 | Wlodarczyk |
| 7,083,121 | B2 | 8/2006 | Huffman |
| 2002/0108875 | A1 | 8/2002 | Feinbert et al. |
| 2004/0250837 | A1 | 12/2004 | Watson et al. |
| 2005/0077399 | A1* | 4/2005 | Watson et al. ............. 239/587.1 |

FOREIGN PATENT DOCUMENTS

| | | | |
|---|---|---|---|
| DE | 1920575 | B | 4/1970 |
| DE | 2534261 | | 4/1976 |
| DE | 4230054 | A1 | 3/1994 |
| DE | 19544985 | | 6/1996 |
| EP | 0037483 | | 10/1981 |
| EP | 0151815 | | 8/1985 |
| EP | 1486158 | | 12/2004 |
| GB | 1515892 | | 6/1978 |
| WO | 92/21451 | | 12/1992 |

OTHER PUBLICATIONS

Stero, Instruction & Parts Manual, Door, Stero Dishwashing Machines, Feb. 28, 1997, 44 pages.

Experimental and Computational Visualization and Frequency Measurements of the Jet Oscillation Inside a Fluidic Oscillator, O. Uzol, C. Camci, 4th International Symposium on Particle Image Velocimetry, Göttingen, Germany, Sep. 17-19, 2001, PIV '01 Paper 1029, 9 pages.

Hobart Catalog o Replacement Parts Model C44A, C44AW, & C54A Series Dishwashers, From 17820 Rev. D (May 2001, 64 pages.

Hobart C-Line A & AW Dishwashers Instructions, Form 17791 Rev. M (Apr. 2003), 28 pages.

PCT, International Search Report and Written Opinion, International Application No. PCT/US2008/086110 (Aug. 13, 2009).

English Translation—DE 1503901; Filed Jul. 6, 1965; Publication Jul. 10, 1969.

PCT, International Preliminary Report on Patentability, International Application No. PCT/US2008/086110 (Jul. 22, 2010).

Invitation to Pay Additional Fees and Partial International Search, PCT/US2008/086110 (Jun. 9, 2009).

* cited by examiner

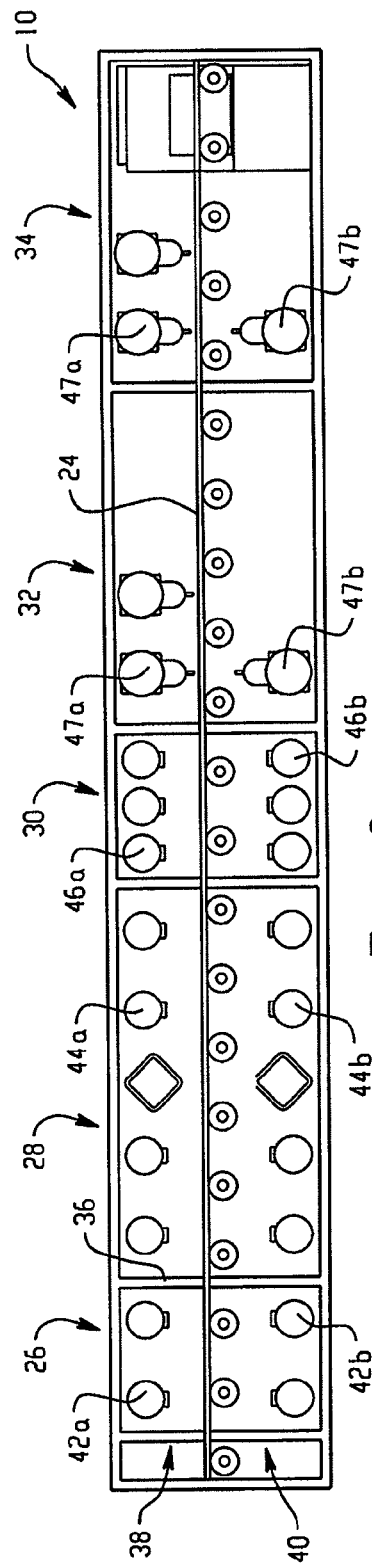
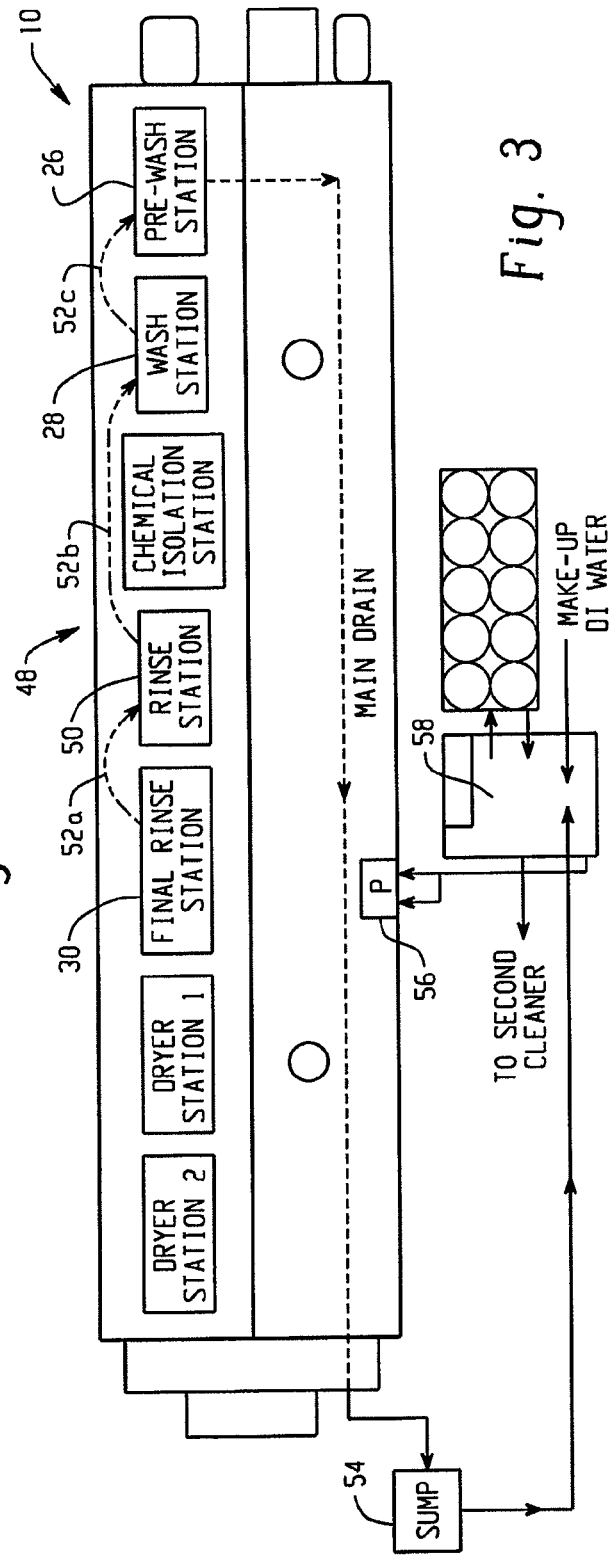

LIQUID CLEANING APPARATUS FOR CLEANING PRINTED CIRCUIT BOARDS

TECHNICAL FIELD

This application relates generally to an apparatus for cleaning printed circuit boards and, more particularly, to a liquid delivery system of a printed circuit board cleaning apparatus and method to deliver liquid to printed circuit boards.

BACKGROUND

Various types of liquid cleaning apparatus are used to clean printed circuit boards for removal of contaminates, such as flux residues, resins and the like. These contaminates remain on the printed circuit board from the soldering process. Many liquid cleaning apparatus include a series of processing chambers, each dedicated to a specific phase of the cleaning process, through which the printed circuit boards pass. Often, a conveyor system including a conveyor belt is used to move the printed circuit boards through the various chambers.

The cleaning materials used for cleaning the printed circuit boards may be determined primarily by the flux technology. For example, water-soluble organic acids may require water only for removal from the printed circuit board and rosin flux technology may require a solvent, semi-aqueous or aqueous cleaning material for removal from the printed circuit board.

Along with the type of cleaning medium, it is also believed that spray geometry during the cleaning process can play an important role in contaminant removal. U.S. Pat. No. 5,129,956, for example, discloses use of a helically-vaned nozzle that produces a cone-shaped spray stream of highly atomized droplets. These highly atomized droplets, however, have a limited amount of energy that can be applied to the printed circuit board on impact.

SUMMARY

In an aspect, a method of cleaning printed circuit boards is provided. The method includes providing a cleaning apparatus with a housing having a conveyance mechanism for carrying printed circuit boards through the housing. The cleaning apparatus has at least a prewash station, a wash station and a final rinse station therein. The printed circuit boards are carried on the conveyance mechanism to the prewash station. A plurality of fluidic oscillator nozzles of the prewash station are utilized to direct liquid onto the printed circuit boards. Each fluidic oscillator nozzle outputs a stream of liquid with an instantaneous direction that oscillates back and forth relative to a nozzle axis over time.

In another aspect, an apparatus for cleaning printed circuit boards includes a housing having an internal space with multiple liquid spraying stations therein including at least a prewash station, a wash station and a final rinse station. A conveyance mechanism carries printed circuit boards through the housing for cleaning. A plurality of fluidic oscillator nozzles are arranged within at least one of the prewash station and the final rinse station to direct liquid onto printed circuit boards carried by the conveyance mechanism. The plurality of fluidic oscillator nozzles includes a first multiplicity of fluidic oscillator nozzles arranged below the conveyance mechanism and directing liquid streams upward and second multiplicity of fluidic oscillator nozzles arranged above the conveyance mechanism and directing liquid streams downward. The second multiplicity of oscillator nozzles are located less than about six inches from an upper side of the conveyance system.

In another aspect, a method of improving a printed circuit board cleaning apparatus is provided. The method includes removing a first liquid delivery arm from a liquid delivery system of the printed circuit board cleaning apparatus. The first liquid delivery arm includes multiple V-jet nozzles for outputting liquid in a spread pattern with drops of liquid simultaneously output in multiple directions within the spread pattern. The first liquid delivery arm is replaced with a second liquid delivery arm by connecting the second liquid delivery arm to the liquid delivery system. The second liquid delivery arm includes multiple fluidic oscillator nozzles for outputting a stream of liquid with an instantaneous direction that oscillates back and forth relative to a nozzle axis over time.

The details of one or more embodiments are set forth in the accompanying drawings and the description below. Other features, objects, and advantages will be apparent from the description and drawings, and from the claims.

BRIEF DESCRIPTION OF THE DRAWINGS

FIG. 2 is a diagrammatic, partial side section view of the cleaning apparatus of FIG. 1;

FIG. 3 is a diagrammatic illustration of an embodiment of a liquid delivery system for use in the cleaning apparatus of FIG. 1;

DETAILED DESCRIPTION

Figure 1:
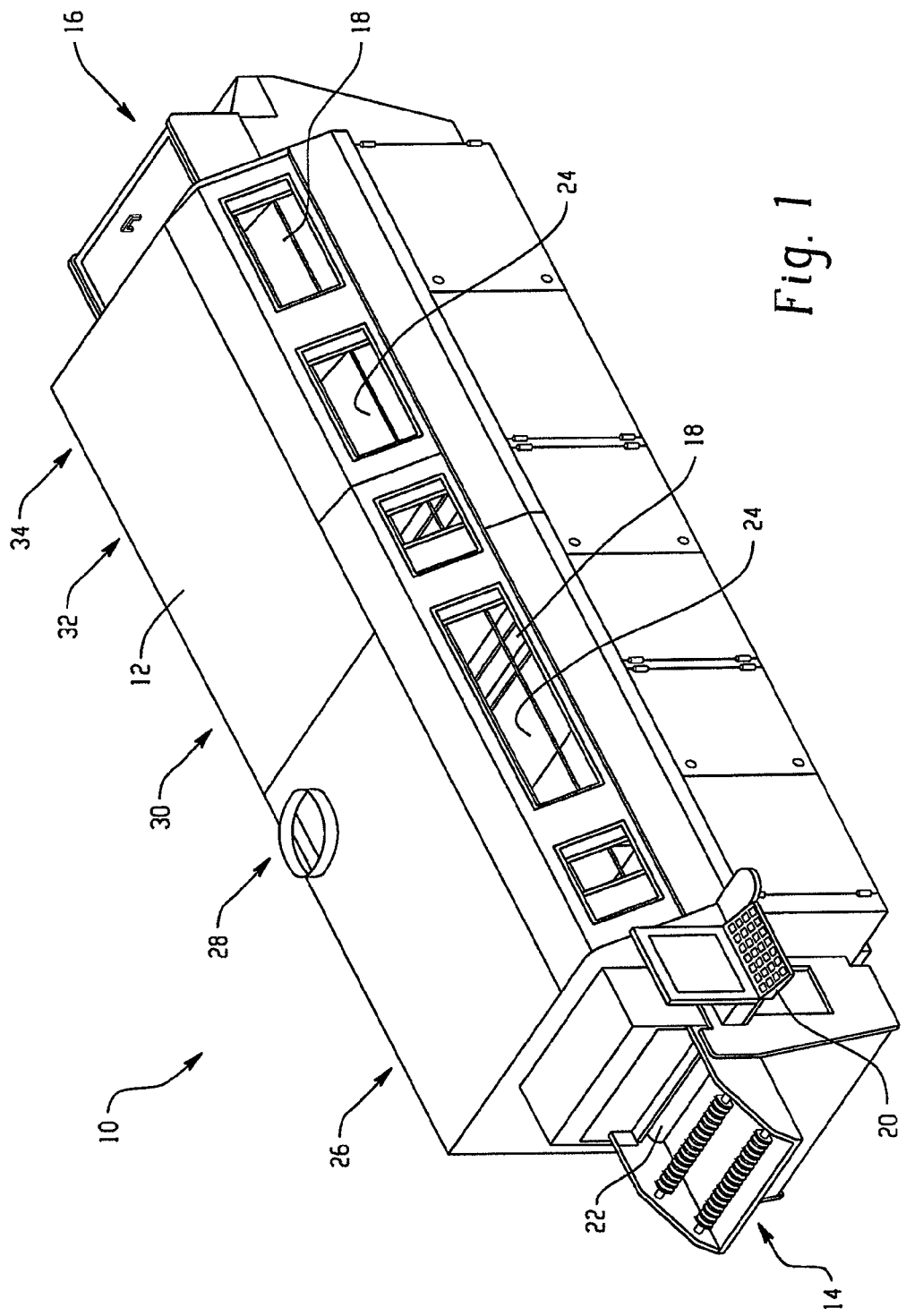
FIG. 1 is a perspective view of an embodiment of a printed circuit board cleaning apparatus.

Referring to FIG. 1, a printed circuit board (PCB) cleaning apparatus 10 includes an enclosed housing 12, a PCB infeed area 14 at which PCBs are fed into the apparatus for cleaning and a PCB outfeed area 16 at which cleaned PCBs can be removed from the apparatus. Multiple windows 18 are provided for allowing viewing within the housing 12. A control station 20 is provided that can be used to monitor operating conditions and to input operating commands.

The infeed area 14 and outfeed area 16 are connected by a conveyance mechanism 22 that includes a conveyor belt 24. The conveyor belt 24 may be of any suitable configuration, one such suitable configuration being a wire mesh belt having a plurality of openings (e.g., about ⅜ inch in diameter) extending therethrough. The wire mesh configuration allows liquid to contact the PCBs from beneath the conveyor belt 24.

Referring also to FIG. 2, the cleaning apparatus 10 is divided into multiple stations: a prewash station 26, a wash station 28, a final rinse station 30, a first drying station 32 and a second drying station 34. In some embodiments, the stations 26, 28, 30, 32 and 34 are separated from each other by a divider 36, such as a curtain. The dividers 36 can limit splash between adjacent sections. Each station 26, 28, 30, 32 and 34 is divided into an upper section 38 and a lower section 40 by the conveyor belt 24. As can be seen most clearly by FIG. 2, the conveyor belt 24 extends continuously through each of the sections 26, 28, 30, 32 and 34, however, in other embodiments, there are multiple conveyor belts aligned end-to-end to carry PCBs through the various sections.

Referring now to FIG. 2, the prewash station 26, wash station 28 and final rinse station 30 each include upper and lower liquid delivery nozzles and the drying stations 32 and 34 include upper and lower blowers. In particular, prewash station 26 includes upper nozzles 42a located at its upper section 38 and lower nozzles 42b located at its lower section 40, wash station 28 includes upper nozzles 44a located at its upper section and lower nozzles 44b located at its lower section and final rinse station 30 includes upper nozzles 46a located at its upper section and lower nozzles 46b located at its lower section. The upper and lower nozzles of each of the stations 26, 28, 30, 32 and 34 point generally toward each other in order to deliver liquid toward the conveyor belt 24. In some embodiments, nozzles may deliver liquid across the conveyor belt 24 (e.g., generally parallel to an upper surface of the conveyor belt 24), for example, in the wash station 28. Each drying station 32 and 34 includes upper and lower blowers 46a and 46b, which may be part of an air knife drying system. One such air knife drying system is described in U.S. Pat. No. 6,260,231.

Referring to FIG. 3, the nozzles are part of a liquid delivery system (referred to generally as element 48). In the embodiment of FIG. 3, the liquid delivery system 48 is of an upward cascading configuration such that liquid delivered to the final rinse station 30 is recycled upstream from the final rinse station, to the wash station 28, then to the prewash station 26. The liquid is delivered initially to the final rinse station 30 because it is often desirable to have the highest quality of liquid used to finally rinse the PCBs. Other configurations are possible, however, as will be described later.

The apparatus embodiment 10 described above with regard to FIG. 3 illustrates a straight aqueous mode in which only water is used to clean the PCBs. It is preferable that deionized and demineralized water be used (referred to as DI water) to clean the PCBs, which is water that has been treated to remove minerals and ions. This purity of water can reduce contamination of parts rinsed in the water as compared to, for example, untreated water. In some embodiments, DI water having a resistivity of at least 3 MΩ·cm is used, such as DI water having a resistivity of about 10-18 MΩ·cm.

As shown by FIG. 3, the DI water is delivered to the final rinse station 30 and circulated through the wash station 28 and the prewash station 26 (and, in some embodiments, a recirculating or primary rinse station 50) as shown by the dotted lines 52a, 52b and 52c. The water is then retreated by delivering the used water through a sump 54 and to a treatment system 58 where minerals and ions are removed. In some instances, some of the used water is removed as waste water and replaced by make-up DI water from a DI water source. The treated DI water is then delivered again to the final rinse station 30. A suitable pump 56 (e.g., a 15 hp pump) is used to circulate the water through the liquid delivery system 48. The pump 56 can draw the water from one or more tanks located in the lower sections 40 of the stations 26, 28 and 30 (see FIG. 4).

Figure 4:
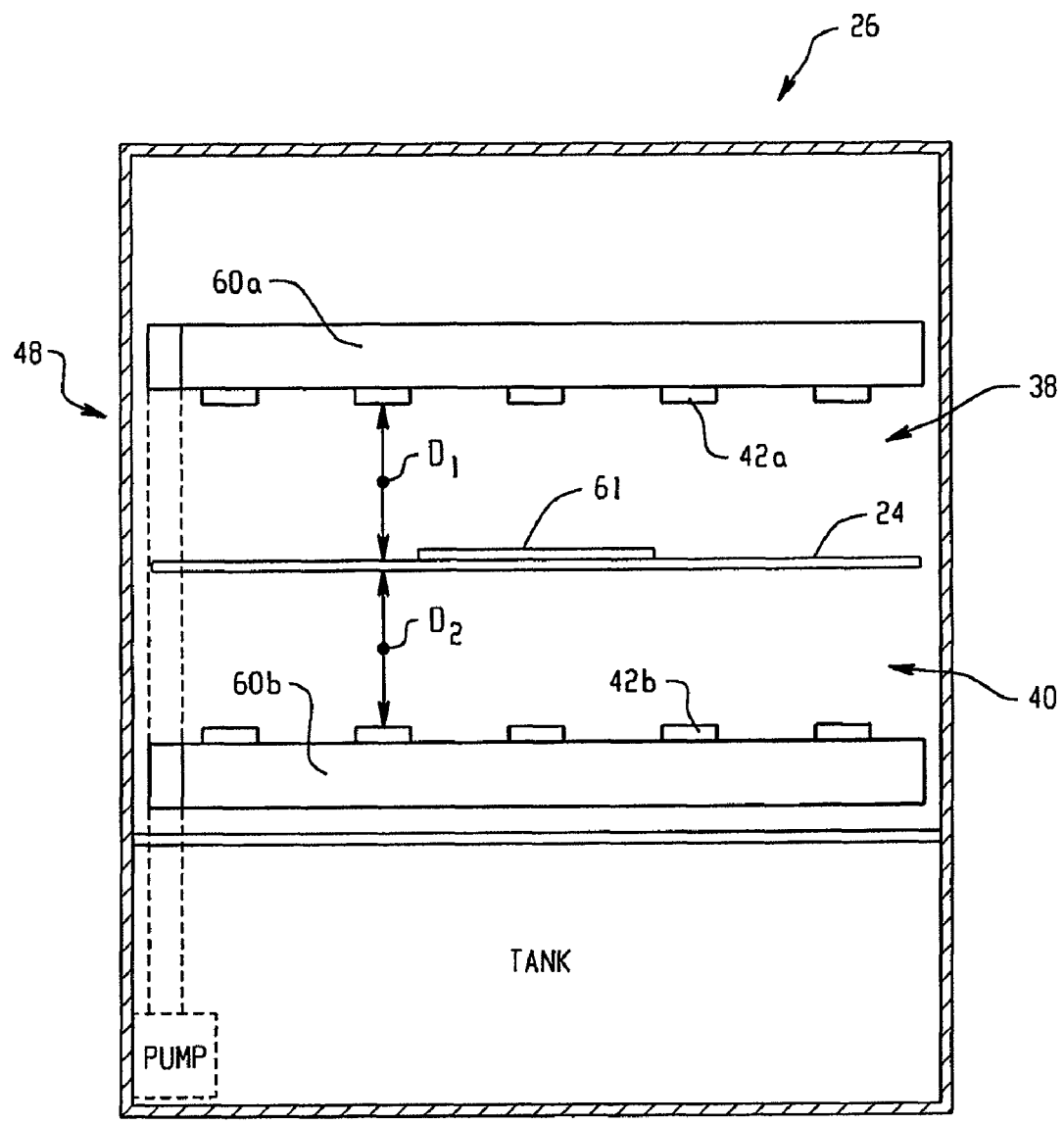
FIG. 4 is a diagrammatic, front section view of the cleaning apparatus of FIG. 1 illustrating a prewash section.

Referring to FIG. 4, a simplified illustration of the prewash station 26 is shown. While prewash station 26 is shown, FIG. 4 could represent any of the final rinse station 30, wash station 28 or primary rinse station 26. The liquid delivery system 48 includes a number of liquid delivery arms 60 located in each of the stations. Liquid delivery arms 60a (e.g., two upper liquid delivery arms) are located in the upper section 38 of the prewash station 20 and liquid delivery arms 60b (e.g., two lower liquid delivery arms) are located in the lower section 40 of the prewash station. Each liquid delivery arm 60 includes a plurality of fluidic oscillator nozzles 42 mounted therein and arranged to direct liquid toward the conveyor belt 24. The liquid delivery arms 60a locate the fluidic oscillator nozzles 42a a distance D1 (e.g., less than six inches, such as between about three and about four inches) above the conveyor belt 24 and the liquid delivery arms 60b locate the fluidic oscillator nozzles 42b a distance D2 (e.g., less than six inches, such as between about three and about four inches) below the conveyor belt.

Figure 5:
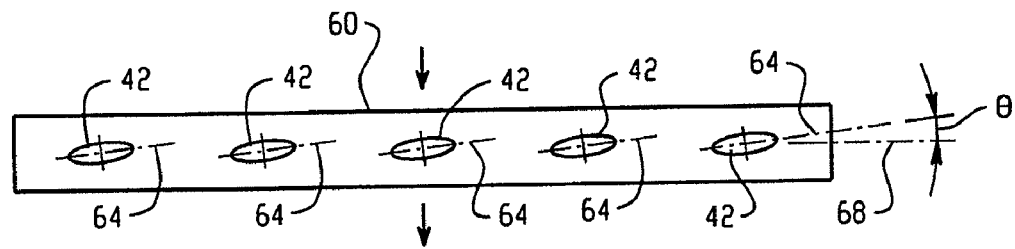
FIGS. 5 and 6 are diagrammatic illustrations of an embodiment of a nozzle arm for use in the cleaning apparatus of FIG. 1.
Figure 6:
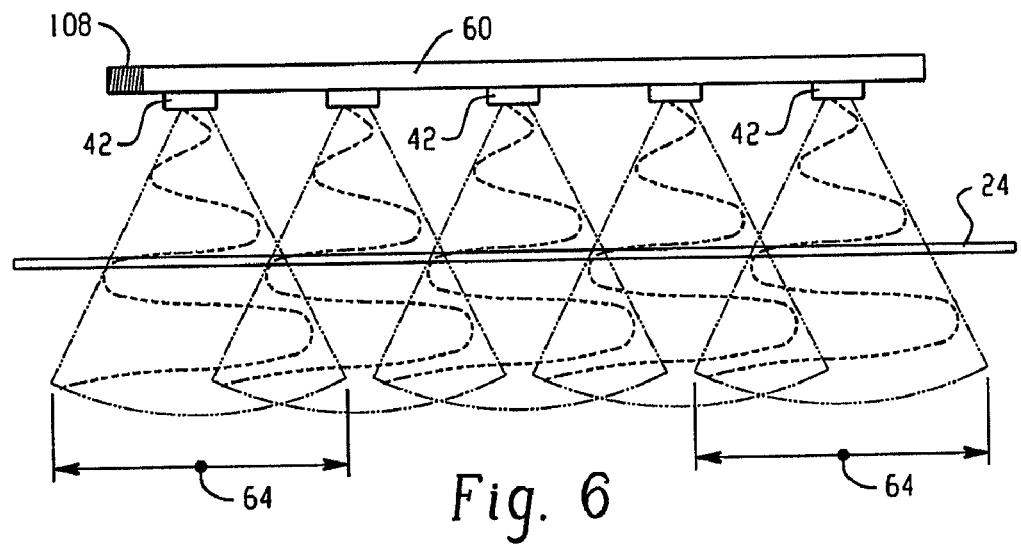
Figure 7:
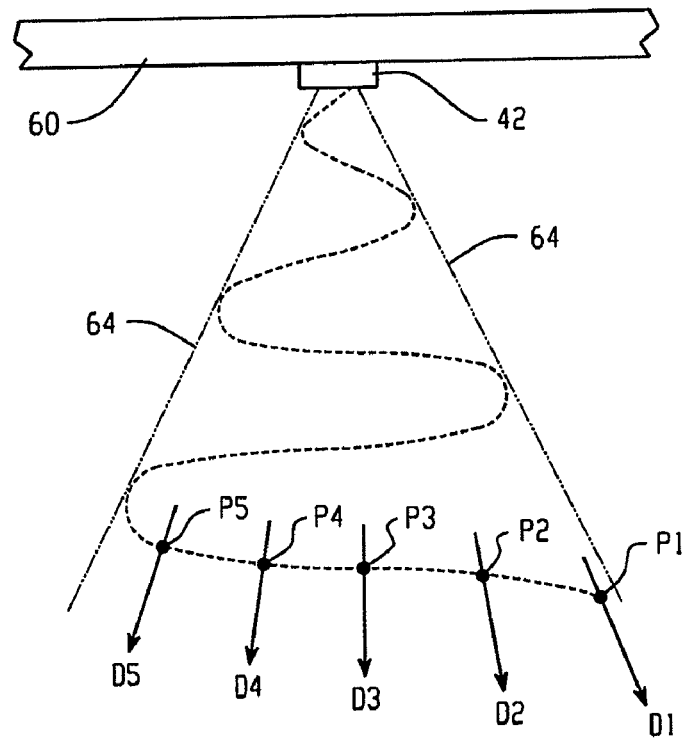
FIG. 7 illustrates an oscillating output stream of a fluidic oscillator nozzle.

Referring to FIG. 5, an exemplary liquid delivery arm 60 includes the fluidic oscillator nozzles 42 positioned thereon for outputting respective streams of liquid. A fluidic oscillator nozzle is generally any nozzle that outputs an oscillating stream of fluid, meaning that the direction of the output stream of fluid varies in an oscillatory manner, as will be described in greater detail below. In the case of liquids, the stream of liquid is typically made up of a series of drops of the liquid being output. The resulting fan shape 64 covered by the sweep of the output stream of each nozzle 42 is best seen by FIG. 6, with the output stream 66 at a given moment in time reflected in FIG. 7. Arrows D1-D5 reflect the instantaneous direction of different points or drops (P1-P5) of the stream output by the port at respectively different times, D1 representing the instantaneous direction for point or drop P1 of the stream output at an earliest point in time, D2 representing the instantaneous direction for point or drop P2 output at a later time and so on. The illustrated arm includes five nozzles 42, but the number of nozzles can vary.

In the illustrated embodiment, the liquid delivery arm 60 extends in a direction across a conveying direction of the conveyor 24 and the fluidic oscillator nozzles 42 are located to assure that rinse liquid covers an entire lateral area of the conveyor. In particular, where the liquid delivery arm 60 is an upper rinse arm, the fan-shaped lateral coverage of the streams overlaps at a location/height that is just above the level of the conveyor 24. Further, in the illustrated embodiment, each of the plurality of fluidic oscillator nozzles 42 is oriented to prevent its output oscillating stream from interfering with oscillating streams output by adjacent fluidic oscillator nozzles. In one example, this result is achieved by orienting each nozzle 42 to output its oscillating stream such that oscillating movement of ejected liquid occurs at an angle $\theta$ relative to a longitudinal axis 68 of the liquid delivery arm 60. In other words, the sweep of the nozzles 42 is skewed to prevent the interference while still assuring complete coverage across the width of the conveyor. In one example, the angle $\theta$ may be in the range of about two to ten degrees, but variations are possible, including angles from zero to ninety degrees. Further, it is recognized that constructions in which adjacent fluid streams interfere with each other are possible.

V-jet nozzles output water in a spread pattern, with drops simultaneously output in multiple directions within the spread, rather than outputting a stream of drops with changing instantaneous direction as fluidic oscillator nozzles 42 do. Fluidic oscillator nozzles 42 can provide an advantage of larger output drop size (in the case of liquids) for a given flow rate than commonly used V-jet nozzles having the same flow rate, providing better washing or rinsing and also reducing heat loss to the air. The large droplet size can produce a higher impact impingement force and can provide greater heat energy to the PCB than a standard mist droplet. In one example, fluidic oscillator's outputs rinse liquid with an average drop size at least twenty-five percent greater than that output by a typical V-jet nozzle having the same flow rate. This larger drop size and increased heat delivery can result in removal of a greater amount of contaminants from the PCB at the prewash station 26. It is contemplated that the fluidic oscillator nozzles 42 will typically be fed by a relatively constant pressure fluid, but a pulsing output from the nozzles could be produced, as by using a liquid manifold having an associated variable pressure mechanism to vary the pressure within the liquid manifold in a pulsed manner.

Referring back to FIG. 4, it is desirable to limit movement of the PCBs 61 as they are conveyed and cleaned in the cleaning apparatus 10. To this end, the fluidic oscillator nozzles 42 of the upper wash arms 60*a* may be fed liquid at a higher pressure than that delivered to the fluidic oscillator nozzles of the lower wash arms 60*b*. In some embodiments, the difference in pressure may be about 5-10 psi. For example, the fluidic oscillator nozzles 42 of the upper wash arms 60*a* may feed liquid at a pressure of about 20 psi and the fluidic oscillator nozzles of the lower wash arms 60*b* may be fed liquid at about 12 psi. Other configurations are possible. The pressure differential tends to maintain the positions of the PCBs as they are conveyed through the apparatus 10.

Stations other than the prewash station 26 may include the fluidic oscillator nozzles in a configuration similar to or the same as that described above with reference to the prewash station 26. For example, referring back to FIG. 2, any of the wash station 28 and the final rinse station 30 may also include the fluidic oscillator nozzles. In some embodiments, the wash station 28 and/or the final rinse station 30 include nozzles of a type other than fluidic oscillator nozzles, such as fanjet nozzles.

Figure 8:
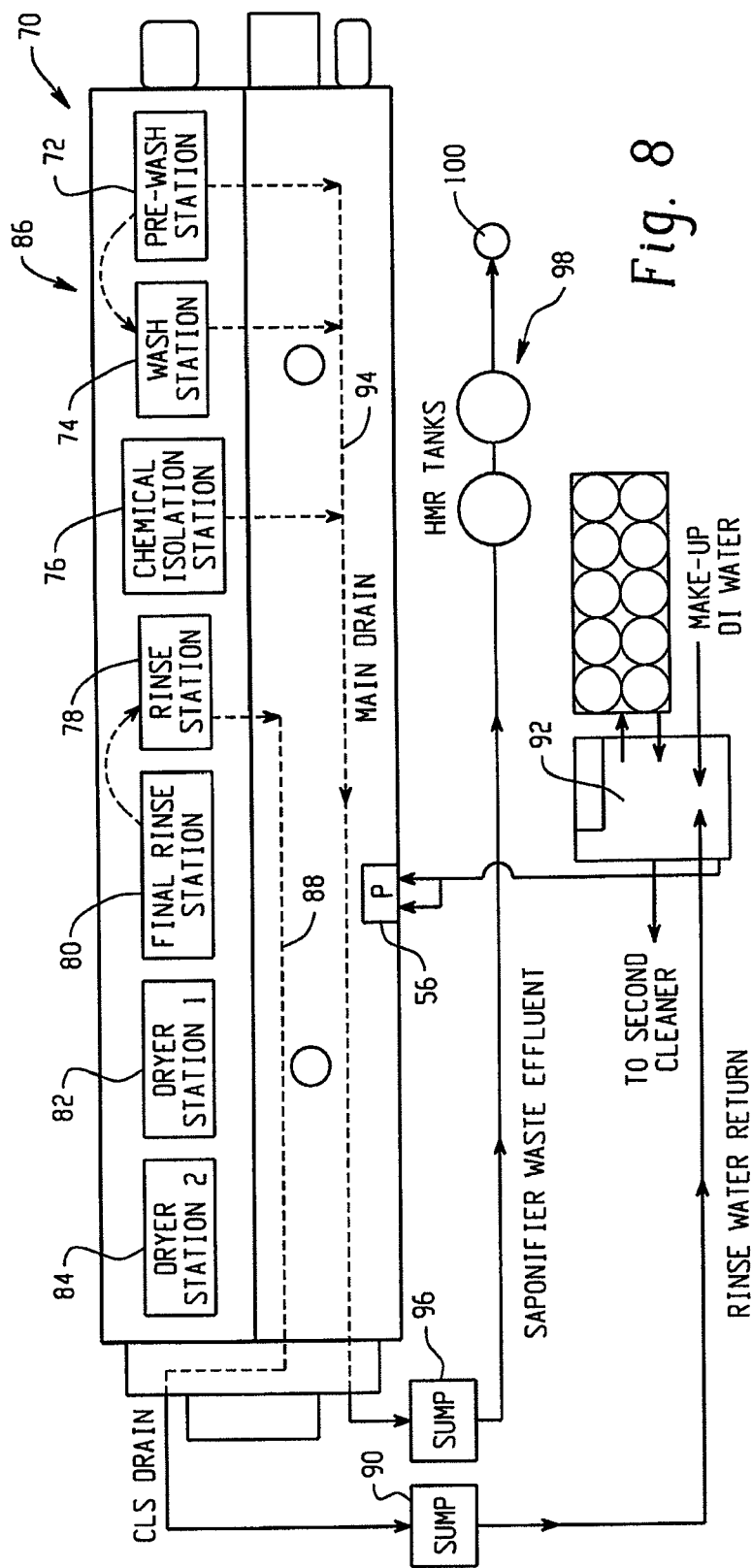
FIG. 8 illustrates an alternative liquid delivery system for a cleaning apparatus having a saponified aqueous mode.

FIG. 8 illustrates an alternative cleaning apparatus 70 in a saponified aqueous mode for use in cleaning water-insoluble materials. In this embodiment, the cleaning apparatus 70 includes a prewash station 72, a wash station 74, a chemical isolation station 76, a recirulating rinse station 78, a final rinse station 80 and two drying stations 82 and 84. A liquid delivery system (referred to generally as element 86) is provided such that the final rinse station 80 and the recirculating or primary rinse station 78 are recirculating through line 88, which leads to a sump 90 and to a treatment system 92 where the water is treated to remove minerals and ions. The treated water is then delivered again to the final rinse station 80, which delivers rinse water to the recirculating rinse station 78.

DI water delivered to the prewash station 72 is from a different source than the DI water delivered through the recirculating system of the final rinse and recirulating stations 80 and 78. The DI water used in the prewash station 72 is delivered to the wash station 74 and then that water is delivered along line 94 along with liquid from the chemical isolation station 76 to a sump 96, through HMR tanks 98 to a drain 100. Thus, DI water delivered to the prewash station 72 and then to the wash station 74 is not recirculating in the sense that is not re-treated and then reused. As another example, a liquid delivery system of the prewash station may be non-recirculating, a liquid delivery system of the wash station may be recirculating, a liquid delivery system of the recirculating rinse station may be recirculating and a liquid delivery system of the final rinse station may be non-recirculating.

Figure 9:
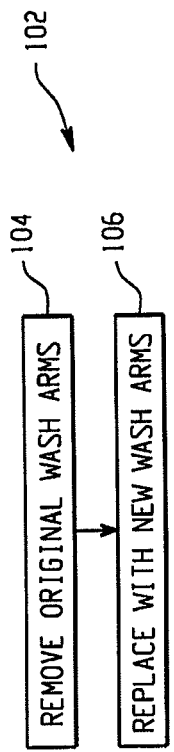
FIG. 9 is a method of retrofitting a cleaning apparatus with fluidic oscillator nozzles.

Referring to FIG. 9, a method 102 of improving a printed circuit board cleaning apparatus involves removing a wash arm including nozzles other than fluidic oscillator nozzles (e.g., V-jet nozzles) at step 104. The wash arm may be provided with a threaded connection 108 (see FIG. 6) or other removable or releasable connection removable from the liquid delivery system. The original wash arm is replaced with wash arms including the fluidic oscillator nozzles at step 106. The wash arm including the fluidic oscillator nozzles may also include a threaded connection located at one end thereof for connection to the liquid delivery system. The wash arm or multiple wash arms may be retrofit at any of the rinsing and/or washing sections described above. In some embodiments, only one or some of the wash arms in the cleaning apparatus are retrofit with the wash arms including the fluidic oscillating nozzles.

It is to be clearly understood that the above description is intended by way of illustration and example only and is not intended to be taken by way of limitation, and that changes and modifications are possible. For example, the cleaning apparatus described above may be of a batch loading configuration where a batch of PCBs are delivered to the cleaning apparatus (e.g., manually). In other embodiments, the cleaning apparatus may be backed up to another apparatus, such as a reflow oven, so that PCBs are delivered to the cleaning apparatus automatically in an inline process. Accordingly, other embodiments are contemplated and modifications and changes could be made without departing from the scope of this application.

What is claimed is:

1. A method of cleaning printed circuit boards, the method comprising:
    providing a cleaning apparatus with a housing having a conveyance mechanism for carrying horizontally oriented printed circuit boards through the housing, the cleaning apparatus having at least a prewash station, a wash station and a final rinse station therein;
    carrying horizontally oriented printed circuit boards on the conveyance mechanism to the prewash station;
    utilizing a plurality of fluidic oscillator nozzles of the prewash station to direct liquid onto the horizontally oriented printed circuit boards, each fluidic oscillator nozzle outputs a stream of liquid with an instantaneous direction that oscillates back and forth relative to a nozzle axis over time, including using a first multiplicity of fluidic oscillator nozzles arranged below the conveyance mechanism to direct liquid streams upward onto the horizontally oriented printed circuit boards and using a second multiplicity of fluidic oscillator nozzles arranged above the conveyance mechanism to direct liquid streams downward onto the horizontally oriented printed circuit boards, where the second multiplicity of fluidic oscillator nozzles located less than about six inches from an upper side of the conveyance system and wherein a liquid delivery pressure to the first multiplicity of fluidic oscillator nozzles is lower than a liquid delivery pressure to the second multiplicity of fluidic oscillator nozzles.

2. The method of claim 1 wherein the fluidic oscillator nozzles are arranged such that oscillation of the liquid streams occurs transverse to the horizontally oriented printed circuit boards.

3. The method of claim 1, including the further step of:
    carrying horizontally oriented printed circuit boards on the conveyance mechanism from the prewash station to the wash station;
    utilizing a plurality of spray nozzles of the wash station to direct liquid onto the horizontally oriented printed circuit boards.

4. The method of claim 3, including the further step of:
    carrying horizontally oriented printed circuit boards on the conveyance mechanism from the wash station to the final rinse station;
    utilizing a plurality of fluidic oscillator nozzles of the final rinse station to direct liquid onto the horizontally oriented printed circuit boards, each fluidic oscillator nozzle of the final rinse station outputs a stream of liquid with an instantaneous direction that oscillates back and forth relative to a nozzle axis over time.

5. The method of claim 4 wherein the liquid directed onto the horizontally oriented printed circuit boards in the final rinse station is DI water having a resistivity of at least 3 MΩ·cm.

6. The method of claim 4 wherein a primary rinse station is provided between the wash station and the final rinse station, the method includes:

utilizing a plurality of spray nozzles of the primary rinse station to direct liquid onto the horizontally oriented printed circuit boards.

7. The method of claim 6 wherein a liquid delivery system of the prewash station is non- recirculating, a liquid delivery system of the wash station is recirculating, a liquid delivery system of the primary rinse station is recirculating and a liquid delivery system of the final rinse station is non-recirculating, the spray nozzles of the wash zone and the primary rinse station are a type other than fluidic oscillator type nozzles.

8. A method of cleaning printed circuit boards, the method comprising:

providing a cleaning apparatus with a housing having a conveyance mechanism for carrying horizontally oriented printed circuit boards along a conveyance path through the housing, the cleaning apparatus having at least a prewash station, a wash station and a final rinse station therein;

carrying horizontally oriented printed circuit boards on the conveyance mechanism through the housing;

utilizing a plurality of fluidic oscillator nozzles located in at a least one of the prewash station, the wash station or the final rinse station to direct liquid onto the horizontally oriented printed circuit boards, each fluidic oscillator nozzle includes a nozzle port that outputs a stream of liquid with an instantaneous direction that oscillates back and forth relative to the nozzle port over time, including using a first multiplicity of fluidic oscillator nozzles arranged above the conveyance path to direct liquid streams onto upper sides of the horizontally oriented printed circuit boards and using a second multiplicity of fluidic oscillator nozzles arranged below the conveyance path to direct liquid streams onto lower sides of the horizontally oriented printed circuit boards, wherein both the second multiplicity of fluidic oscillator nozzles and first multiplicity of fluidic oscillator nozzles are located less than about six inches from the conveyance path;

wherein a liquid delivery pressure to the second multiplicity of fluidic oscillator nozzles is lower than a liquid delivery pressure to the first multiplicity of fluidic oscillator nozzles.

* * * * *